(12) United States Patent  
Brindani et al.

(10) Patent No.: US 11,246,191 B2
(45) Date of Patent: Feb. 8, 2022

(54) METHOD AND SYSTEM FOR RADIO FREQUENCY ELECTROMAGNETIC ENERGY DELIVERY

(71) Applicants: WHIRLPOOL CORPORATION, Benton Harbor, MI (US); Panasonic Corporation, Osaka (JP)

(72) Inventors: Franco Brindani, Ternate (IT); Andrea Gallivanoni, Casorate Sempione (IT); Peter A. M. Van Der Cammen, Delft (NA)

(73) Assignees: Whirlpool Corporation, Benton Harbor, MI (US); Panasonic Corporation

( * ) Notice: Subject to any disclaimer, the term of this patent is extended or adjusted under 35 U.S.C. 154(b) by 346 days.

(21) Appl. No.: 16/312,320

(22) PCT Filed: Sep. 22, 2016

(86) PCT No.: PCT/US2016/053049
§ 371 (c)(1),
(2) Date: Dec. 21, 2018

(87) PCT Pub. No.: WO2018/056977
PCT Pub. Date: Mar. 29, 2018

(65) Prior Publication Data
US 2019/0208588 A1  Jul. 4, 2019

(51) Int. Cl.
*H05B 6/68* (2006.01)
*H05B 6/70* (2006.01)
(Continued)

(52) U.S. Cl.
CPC ............. *H05B 6/687* (2013.01); *H05B 6/664* (2013.01); *H05B 6/686* (2013.01); *H05B 6/705* (2013.01); *H03F 3/20* (2013.01); *H03F 2200/451* (2013.01)

(58) Field of Classification Search
CPC ..... H03F 2200/451; H03F 3/20; H05B 6/664; H05B 6/686; H05B 6/687; H05B 6/705
(Continued)

(56) References Cited

U.S. PATENT DOCUMENTS 3,536,129 A  10/1970 White
3,603,241 A  9/1971 Drucker
(Continued)

FOREIGN PATENT DOCUMENTS

CN  103175237 A  6/2013
EP  0550312 A2  7/1993
(Continued)

*Primary Examiner* — Quang T Van
(74) *Attorney, Agent, or Firm* — Price Heneveld LLP

(57) ABSTRACT

An electromagnetic energy delivery system includes a set of radio frequency channels. Each channel includes a radio frequency feed, at least one high-power amplifier and a phase-shifting component. Each high-power radio frequency amplifier includes at least one amplifying component configured to output a periodic signal that is amplified in power with respect to an input radio frequency common reference signal. The phase-shifting component is configured to modulate the phase of the output periodic signal with respect to the input radio frequency signal. A controller coupled to the set of radio frequency channels can be configured to cause the output periodic signals from each of the radio frequency channels is to have a time-varying phase difference relative to the common reference signal and a phase difference relative to the other output periodic signals that is constant when averaged over time.

20 Claims, 10 Drawing Sheets

(51) Int. Cl.
*H05B 6/66* (2006.01)
*H03F 3/20* (2006.01)

(58) Field of Classification Search
USPC ....... 219/747, 746, 748, 750, 702, 705, 709, 219/710, 711, 697; 327/107; 342/434, 342/147, 194
See application file for complete search history.

(56) References Cited

U.S. PATENT DOCUMENTS

| | | |
|---|---|---|
| 3,835,921 A | 9/1974 | Faris et al. |
| 4,196,332 A | 4/1980 | MacKay et al. |
| 4,210,795 A | 7/1980 | Lentz |
| 4,374,319 A | 2/1983 | Guibert |
| 4,481,519 A | 11/1984 | Margerum |
| 4,777,336 A | 10/1988 | Asmussen |
| 4,831,239 A | 5/1989 | Ueda |
| 4,868,357 A | 9/1989 | Serikawa et al. |
| 4,996,403 A | 2/1991 | White |
| 5,008,506 A | 4/1991 | Asmussen et al. |
| 5,094,865 A | 3/1992 | Levinson |
| 5,293,019 A | 3/1994 | Lee |
| 5,360,965 A | 11/1994 | Ishii et al. |
| 5,361,681 A | 11/1994 | Hedstrom et al. |
| 5,369,253 A | 11/1994 | Kuwata et al. |
| 5,389,764 A | 2/1995 | Nishii et al. |
| 5,512,736 A | 4/1996 | Kang et al. |
| 5,521,360 A | 5/1996 | Johnson et al. |
| 5,632,921 A | 5/1997 | Risman et al. |
| 5,648,038 A | 7/1997 | Fathi et al. |
| 5,681,496 A | 10/1997 | Brownlow et al. |
| 5,756,970 A | 5/1998 | Barger et al. |
| 5,828,042 A | 10/1998 | Choi et al. |
| 5,961,871 A | 10/1999 | Bible et al. |
| 6,034,363 A | 3/2000 | Barmatz et al. |
| 6,066,838 A | 5/2000 | Koda et al. |
| 6,150,645 A | 11/2000 | Lewis et al. |
| 6,172,348 B1 | 1/2001 | Yoshino et al. |
| 6,559,882 B1 | 5/2003 | Kerchner |
| 6,884,979 B1 | 4/2005 | Torngren et al. |
| 7,105,787 B2 | 9/2006 | Clemen, Jr. |
| 7,111,247 B2 | 9/2006 | Choi et al. |
| 7,191,698 B2 | 3/2007 | Bond et al. |
| 7,326,888 B2 | 2/2008 | Chun et al. |
| 7,461,588 B2 | 12/2008 | Head |
| 7,501,608 B2 | 3/2009 | Hallgren et al. |
| 7,923,664 B2 | 4/2011 | Kruempelmann et al. |
| 7,992,552 B2 | 8/2011 | Hirano et al. |
| 8,207,479 B2 | 6/2012 | Ben-Shmuel et al. |
| 8,218,402 B2 | 7/2012 | Lewis et al. |
| 8,283,605 B2 | 10/2012 | Arione et al. |
| 8,324,540 B2 | 12/2012 | Nordh et al. |
| 8,330,085 B2 | 12/2012 | Ishizaki et al. |
| 8,338,763 B2 | 12/2012 | Nordh et al. |
| 8,389,916 B2 | 3/2013 | Ben-Shmuel et al. |
| 8,610,038 B2 | 12/2013 | Hyde et al. |
| 8,742,305 B2 | 6/2014 | Simunovic et al. |
| 8,742,306 B2 | 6/2014 | Atzmony et al. |
| 8,839,527 B2 | 9/2014 | Ben-Shmuel et al. |
| 8,922,969 B2 | 12/2014 | Sigalov et al. |
| 8,927,913 B2 | 1/2015 | Hyde et al. |
| 9,035,224 B2 | 5/2015 | Lim et al. |
| 9,040,879 B2 | 5/2015 | Libman et al. |
| 9,078,298 B2 | 7/2015 | Ben-Shmuel et al. |
| 9,131,543 B2 | 9/2015 | Ben-Shmuel et al. |
| 9,132,408 B2 | 9/2015 | Einziger et al. |
| 9,161,390 B2 | 10/2015 | Gelbart et al. |
| 9,161,394 B2 | 10/2015 | Carlsson et al. |
| 9,167,633 B2 | 10/2015 | Ben-Shmuel et al. |
| 9,210,740 B2 | 12/2015 | Libman et al. |
| 9,215,756 B2 | 12/2015 | Bilchinsky et al. |
| 9,301,344 B2 | 3/2016 | Ibragimov et al. |
| 9,307,583 B2 | 4/2016 | Sim et al. |
| 9,332,591 B2 | 5/2016 | Libman et al. |
| 9,351,347 B2 | 5/2016 | Torres et al. |
| 9,363,852 B2 | 6/2016 | Carlsson et al. |
| 9,363,854 B2 | 6/2016 | Sim et al. |
| 9,374,852 B2 | 6/2016 | Bilchinsky et al. |
| 9,398,644 B2 | 7/2016 | Okajima |
| 9,398,646 B2 | 7/2016 | Nobue et al. |
| 9,414,444 B2 | 8/2016 | Libman et al. |
| 9,459,346 B2 | 10/2016 | Einziger et al. |
| 9,462,635 B2 | 10/2016 | Bilchinsky et al. |
| 9,462,642 B2 | 10/2016 | Chu et al. |
| 2003/0070799 A1 | 4/2003 | Mueller et al. |
| 2006/0191926 A1 | 8/2006 | Ray et al. |
| 2008/0105675 A1 | 5/2008 | Choi et al. |
| 2008/0297208 A1 | 12/2008 | Baudin et al. |
| 2009/0011101 A1 | 1/2009 | Doherty et al. |
| 2009/0236333 A1 | 9/2009 | Ben-Shmuel et al. |
| 2009/0321428 A1 | 12/2009 | Hyde et al. |
| 2010/0059509 A1 | 3/2010 | Imai et al. |
| 2010/0176121 A1 | 7/2010 | Nobue et al. |
| 2010/0176123 A1* | 7/2010 | Mihara .................. H05B 6/686 219/746 |
| 2010/0182136 A1 | 7/2010 | Pryor |
| 2010/0187224 A1 | 7/2010 | Hyde et al. |
| 2010/0231506 A1 | 9/2010 | Pryor |
| 2011/0139773 A1 | 6/2011 | Fagrell et al. |
| 2012/0067873 A1 | 3/2012 | Mihara et al. |
| 2012/0103972 A1 | 5/2012 | Okajima |
| 2012/0168645 A1 | 7/2012 | Atzmony et al. |
| 2012/0312801 A1 | 12/2012 | Bilchinsky et al. |
| 2013/0048881 A1 | 2/2013 | Einziger et al. |
| 2013/0056460 A1 | 3/2013 | Ben-Shmuel et al. |
| 2013/0080098 A1 | 3/2013 | Hadad et al. |
| 2013/0142923 A1 | 6/2013 | Torres et al. |
| 2013/0146590 A1 | 6/2013 | Einziger et al. |
| 2013/0186887 A1 | 7/2013 | Hallgren et al. |
| 2013/0206752 A1 | 8/2013 | Moon et al. |
| 2013/0240757 A1 | 9/2013 | Einziger et al. |
| 2013/0334215 A1 | 12/2013 | Chen et al. |
| 2014/0203012 A1 | 7/2014 | Corona et al. |
| 2014/0287100 A1 | 9/2014 | Libman |
| 2014/0305934 A1 | 10/2014 | DeCamillis et al. |
| 2015/0070029 A1 | 3/2015 | Libman et al. |
| 2015/0136760 A1 | 5/2015 | Lima et al. |
| 2015/0156823 A1 | 6/2015 | Okajima |
| 2015/0156827 A1 | 6/2015 | Ibragimov et al. |
| 2015/0271877 A1 | 9/2015 | Johansson |
| 2015/0346335 A1 | 12/2015 | Einziger et al. |
| 2015/0366006 A1 | 12/2015 | Ben-Shmuel et al. |
| 2016/0073453 A1 | 3/2016 | Hyde et al. |
| 2016/0095171 A1 | 3/2016 | Chaimov et al. |
| 2016/0128138 A1 | 5/2016 | Li et al. |
| 2016/0205973 A1 | 7/2016 | An et al. |
| 2016/0249416 A1 | 8/2016 | Elboim et al. |
| 2016/0273970 A1 | 9/2016 | Alon et al. |
| 2016/0278170 A1 | 9/2016 | Atherton et al. |
| 2016/0323940 A1 | 11/2016 | Guatta |
| 2016/0330803 A1 | 11/2016 | Guatta |
| 2017/0353200 A1* | 12/2017 | Shen ....................... H03F 3/211 |

FOREIGN PATENT DOCUMENTS

| | | |
|---|---|---|
| EP | 1076475 A2 | 2/2001 |
| EP | 1193584 A1 | 4/2002 |
| EP | 1471773 A2 | 10/2004 |
| EP | 1795814 A2 | 6/2007 |
| EP | 2051564 A2 | 4/2009 |
| EP | 2512206 A1 | 10/2012 |
| EP | 2824991 A1 | 1/2015 |
| EP | 2446703 B1 | 4/2015 |
| EP | 2446704 B1 | 4/2015 |
| EP | 2446705 B1 | 4/2015 |
| EP | 2906021 A1 | 8/2015 |
| EP | 2916619 A1 | 9/2015 |
| EP | 2446706 B1 | 1/2016 |
| EP | 2983290 A1 | 2/2016 |
| EP | 2205043 B1 | 1/2017 |
| EP | 2239994 B1 | 11/2018 |
| FR | 2766272 A1 | 1/1999 |
| GB | 2193619 A | 2/1988 |

(56) References Cited

FOREIGN PATENT DOCUMENTS

| | | |
|---|---|---|
| RU | 2253193 C2 | 5/2005 |
| WO | 9107069 | 5/1991 |
| WO | 9913688 | 3/1999 |
| WO | 0036880 | 6/2000 |
| WO | 0223953 A1 | 3/2002 |
| WO | 2008018466 A1 | 2/2008 |
| WO | 2010052724 A2 | 5/2010 |
| WO | 2011058537 A1 | 5/2011 |
| WO | 2011108016 A1 | 9/2011 |
| WO | 2011138675 A2 | 11/2011 |
| WO | 2011138688 A2 | 11/2011 |
| WO | 2012052894 A1 | 4/2012 |
| WO | 2012162072 A1 | 11/2012 |
| WO | 2013078325 A1 | 5/2013 |
| WO | 2014006510 A2 | 1/2014 |
| WO | 2014024044 A1 | 2/2014 |
| WO | 2015099651 A1 | 7/2015 |
| WO | 2015127999 A1 | 9/2015 |
| WO | 2016144872 A1 | 9/2016 |

\* cited by examiner

METHOD AND SYSTEM FOR RADIO FREQUENCY ELECTROMAGNETIC ENERGY DELIVERY

BACKGROUND

The present device generally relates to a method and device for electromagnetic cooking, and more specifically, to a method and device for controlling the distribution of electromagnetic energy within a microwave oven.

A conventional microwave oven cooks food by a process of dielectric heating in which a high-frequency alternating electromagnetic field is distributed throughout an enclosed cavity. A sub-band of the radio frequency spectrum, microwave frequencies at or around 2.45 GHz cause dielectric heating primarily by absorption of energy in water.

To generate microwave frequency radiation in a conventional microwave, a voltage applied to a high-voltage transformer results in a high-voltage power that is applied to a magnetron that generates microwave frequency radiation. The microwaves are then transmitted to an enclosed cavity containing the food through a waveguide. Cooking food in an enclosed cavity with a single, non-coherent source like a magnetron can result in non-uniform heating of the food. To more evenly heat food, microwave ovens include, among other things, mechanical solutions such as a microwave stirrer and a turntable for rotating the food. A common magnetron-based microwave source is not narrowband and not tunable (i.e. emits microwaves at a frequency that is changing over time and not selectable). As an alternative to such a common magnetron-based microwave source, solid-state sources can be included in microwave ovens that are tunable and coherent.

SUMMARY

In one aspect, an electromagnetic energy delivery system includes a set of radio frequency channels; each channel including a radio frequency feed configured to radiate electromagnetic energy; at least one high-power radio frequency amplifier coupled to the radio frequency feed, each high-power radio frequency amplifier including at least one amplifying component configured to output a periodic signal that is amplified in power with respect to an input radio frequency common reference signal; and a phase-shifting component configured to modulate the phase of the output periodic signal with respect to the input radio frequency signal. The system can also include a controller coupled to the set of radio frequency channels where the controller is configured to cause the output periodic signals from each of the radio frequency channels to have a time-varying phase difference relative to the common reference signal and a phase difference relative to the other output periodic signals that is constant when averaged over time.

In another aspect, a method of delivering radio frequency electromagnetic energy to cook foodstuff in an enclosed cavity of a cooking device includes generating, with a microwave signal generating component, a common reference radio frequency signal at a first phase; feeding the common reference radio frequency signal to a set of output channels, each channel configured to deliver an output radio frequency signal to the enclosed cavity; and modulating the phase, by a phase shifting component, of each of the output radio frequency signals. Each output signal is configured to provide a time-varying phase difference relative to the common reference signal and a phase difference relative to the other output signals that is constant when averaged over time.

DETAILED DESCRIPTION

It is to be understood that the specific devices and processes illustrated in the attached drawings and described in the following specification are simply exemplary embodiments of the inventive concepts defined in the appended claims. Hence, other physical characteristics relating to the embodiments disclosed herein are not to be considered as limiting, unless the claims expressly state otherwise.

A solid-state radio frequency (RF) cooking appliance heats up and prepares food by introducing electromagnetic radiation into an enclosed cavity. Multiple RF feeds at different locations in the enclosed cavity produce dynamic electromagnetic wave patterns as they radiate. To control and shape the wave patterns in the enclosed cavity, the multiple RF feeds can radiate waves with separately controlled electromagnetic characteristics to maintain coherence (that is, a stationary interference pattern) within the enclosed cavity. For example, each RF feed can transmit a different frequency, phase or amplitude with respect to the other feeds. Other electromagnetic characteristics can be common among the RF feeds. For example, each RF feed can transmit at a common but variable frequency.

Although the following embodiments are directed to a cooking appliance where RF feeds direct electromagnetic radiation to heat an object in an enclosed cavity, it will be understood that the methods described herein and the inventive concepts derived herefrom are not so limited. The covered concepts and methods are applicable to any RF device where more than one RF feed directs electromagnetic radiation to a shared space to act on an object. The shared space can include an enclosed cavity or an area in free space. Exemplary devices include ovens, dryers, steamers, and the like.

Figure 1:
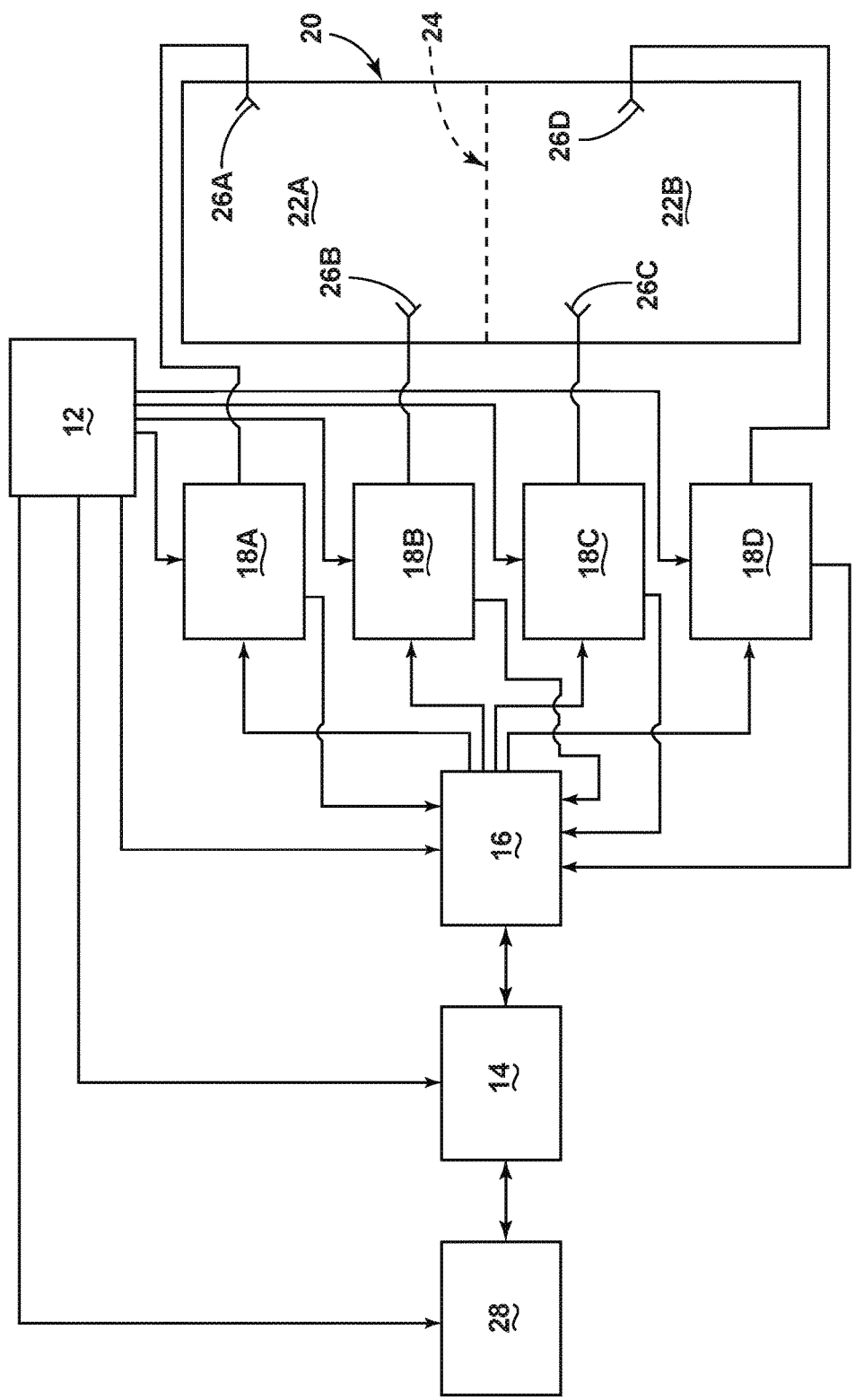
FIG. 1 is a block diagram illustrating an electromagnetic cooking device with multiple coherent radio frequency feeds in accordance with various aspects described herein.

FIG. 1 shows a block diagram of an electromagnetic cooking device 10 with multiple coherent RF feeds 26A-D according to one embodiment. As shown in FIG. 1, the electromagnetic cooking device 10 includes a power supply 12, a controller 14, an RF signal generator 16, a human-machine interface 28 and multiple high-power RF amplifiers 18A-D coupled to the multiple RF feeds 26A-D. The multiple RF feeds 26A-D each couple RF power from one of the multiple high-power RF amplifiers 18A-D into an enclosed cavity 20.

The power supply 12 provides electrical power derived from mains electricity to the controller 14, the RF signal generator 16, the human-machine interface 28 and the multiple high-power RF amplifiers 18A-D. The power supply 12 converts the mains electricity to the required power level of each of the devices it powers. The power supply 12 can deliver a variable output voltage level. For example, the power supply 12 can output a voltage level selectively controlled in 0.5-Volt steps. In this way, the power supply 12 can be configured to typically supply 28 Volts direct current to each of the high-power RF amplifiers 18A-D, but can supply a lower voltage, such as 15 Volts direct current, to decrease an RF output power level by a desired level.

A controller 14 can be included in the electromagnetic cooking device 10, which can be operably coupled with various components of the electromagnetic cooking device 10 to implement a cooking cycle. The controller 14 can also be operably coupled with a control panel or human-machine interface 28 for receiving user-selected inputs and communicating information to a user. The human-machine interface 28 can include operational controls such as dials, lights, switches, touch screen elements, and displays enabling a user to input commands, such as a cooking cycle, to the controller 14 and receive information. The user interface 28 can include one or more elements, which can be centralized or dispersed relative to each other. The controller 14 may also select the voltage level supplied by the power supply 12.

The controller 14 can be provided with a memory and a central processing unit (CPU), and can be preferably embodied in a microcontroller. The memory can be used for storing control software that can be executed by the CPU in completing a cooking cycle. For example, the memory can store one or more pre-programmed cooking cycles that can be selected by a user and completed by the electromagnetic cooking device 10. The controller 14 can also receive input from one or more sensors. Non-limiting examples of sensors that can be communicably coupled with the controller 14 include peak level detectors known in the art of RF engineering for measuring RF power levels and temperature sensors for measuring the temperature of the enclosed cavity or one or more of the high-power amplifiers 18A-D.

The RF signal generator 16 can include one or more components to determine and generate the actual frequencies, phases and amplitudes to be output to the high-power amplifiers. The RF signal generator 16 can include a programmable RF controlling component, preferably implemented as a digital control interface. The RF signal generator 16 can be physically separate from the cooking controller 14 or can be physically mounted onto or integrated into the controller 14. The RF signal generator 16 can be formed with electronic components suitable for generating RF signals including, but not limited to a bespoke integrated circuit.

As shown in FIG. 1, the RF signal generator 16 outputs four RF channels that share a common but variable frequency (e.g. ranging from 2.4 GHz to 2.5 GHz), but are settable in phase and amplitude for each RF feed 26A-D. The configuration described herein is exemplary and should not be considered limiting. For example, the RF signal generator 16 can be configured to output to more or fewer RF feeds and can include the capability to output a unique variable frequency for each of the channels depending upon the implementation.

Based on the user input provided by the human-machine interface 28 and data including the forward and backward (or reflected) power magnitudes coming from the multiple high-power amplifiers 18A-D (represented in FIG. 1 by the path from each of the high-power amplifiers 18A-D through the RF signal generator 16 to the controller 14), the controller 14 can determine the cooking strategy and calculate the settings for the RF signal generator 16. In this way, one of the main functions of the controller 14 is to actuate the electromagnetic cooking device 10 to instantiate the cooking cycle as initiated by the user. The RF signal generator 16 can generate multiple RF waveforms, that is, one for each high-power amplifier 18A-D based on the settings indicated by the controller 14.

The high-power amplifiers 18A-D, each coupled to one of the RF feeds 26A-D, each output a high power RF signal based on a low power common reference RF signal provided by the RF signal generator 16. The low power RF signal input to each of the high-power amplifiers 18A-D can be amplified by transforming the direct current electrical power provided by the power supply 12 into a high power RF signal. In one non-limiting example, each high-power amplifier 18A-D can be configured to output an RF signal ranging from 50 to 250 Watts. The maximum output wattage for each high-power amplifier can be more or less than 250 Watts depending upon the implementation. Each high-power amplifier 18A-D can include a dummy load to absorb excessive RF reflections.

The multiple RF feeds 26A-D couple power from the multiple high-power RF amplifiers 18A-D to the enclosed cavity 20. The multiple RF feeds 26A-D can be coupled to the enclosed cavity 20 in spatially separated but fixed physical locations. The multiple RF feeds 26A-D can be implemented via any structures designed for low power loss propagation of RF signals including, but not limited to, waveguides, antennas, etc. In one non-limiting example, metallic, rectangular waveguides known in microwave engineering are capable of guiding RF power from a high-power amplifier 18A-D to the enclosed cavity 20 with a power attenuation of approximately 0.03 decibels per meter.

Additionally, each of the RF feeds 26A-D can include a sensing capability to measure the magnitude of the forward and the backward power levels or phase at the amplifier output. The measured backward power indicates a power level returned to the high-power amplifier 18A-D as a result of an impedance mismatch between the high-power amplifier 18A-D and the enclosed cavity 20. Besides providing feedback to the controller 14 and the RF signal generator 16 to implement, in part, a cooking strategy, the backward power level can indicate excess reflected power that can damage the high-power amplifier 18A-D.

Along with the determination of the backward power level at each of the high-power amplifiers 18A-D, temperature sensing at the high-power amplifier 18A-D can provide data necessary to determine if the backward power level has exceeded a predetermined threshold. If the threshold is exceeded, any of the controlling elements in the RF transmission chain including the power supply 12, controller 14, the RF signal generator 16, or the high-power amplifier 18A-D can determine that the high-power amplifier 18A-D should be switched to a lower power level or completely turned off. For example, each high-power amplifier 18A-D can switch off automatically if the backward power level or sensed temperature is too high for several milliseconds. In another example, the power supply 12 can cut the direct current power supplied to the high-power amplifier 18A-D.

The enclosed cavity 20 can selectively include subcavities 22A-B by insertion of an optional divider 24 therein. The enclosed cavity 20 can include, on at least one side, a shielded door to allow user access to the interior of the enclosed cavity 20 for placement and retrieval of food or the optional divider 24.

The transmitted bandwidth of each of the RF feeds 26A-D can include frequencies ranging from 2.4 GHz to 2.5 GHz. The RF feeds 26A-D can be configured to transmit other RF bands. For example, the bandwidth of frequencies between 2.4 GHz and 2.5 GHz is one of several bands that make up the industrial, scientific and medical (ISM) radio bands. The transmission of other RF bands is contemplated and can include non-limiting examples contained in the ISM bands defined by the frequencies: 13.553 MHz to 13.567 MHz, 26.957 MHz to 27.283 MHz, 902 MHz to 928 MHz, 5.725 GHz to 5.875 GHz and 24 GHz to 24.250 GHz.

The electromagnetic cooking device 10 can deliver a controlled amount of power at multiple RF feeds 26A-D into the enclosed cavity 20. Further, by maintaining control of the amplitude, frequency and phase of the electromagnetic energy delivered from each RF feed 26A-D, the electromagnetic cooking device 10 can coherently control the power delivered into the enclosed cavity 20. Coherent RF sources deliver power in a controlled manner to exploit the interference properties of electromagnetic waves. That is, over a defined area of space and duration of time, coherent RF sources can produce stationary interference patterns such that the electric field is distributed in an additive manner. Consequently, interference patterns can add to create an electromagnetic field distribution that is greater in amplitude than any of the RF sources (i.e. constructive interference) or less than any of the RF sources (i.e. destructive interference).

The coordination of the RF sources and characterization of the operating environment (e.g. the enclosed cavity 20 and the contents within) can enable coherent control of the electromagnetic cooking and maximize the coupling of RF power with an object in the enclosed cavity 20. Efficient transmission into the operating environment can require calibration of the RF generating procedure. In an electromagnetic heating system, the power level can be controlled by many components including the voltage output from the power supply 12, the gain of the high-power amplifiers 18A-D, etc. Other factors that affect the output power level include the age of the components, inter-component interaction and component temperature.

Control of the interference patterns generated within the enclosed cavity 20 depends on the accuracy of the relative phase differences between the electromagnetic signals output from each RF feed 26A-D. The RF signal generator 16, the high-power amplifiers 18A-D and the RF feeds 26A-D of the electromagnetic cooking device 10 exemplify an RF electromagnetic energy delivery system that can be configured to concurrently output two or more periodic signals with the same frequency and an adjustable phase difference between the signals.

Figure 2:
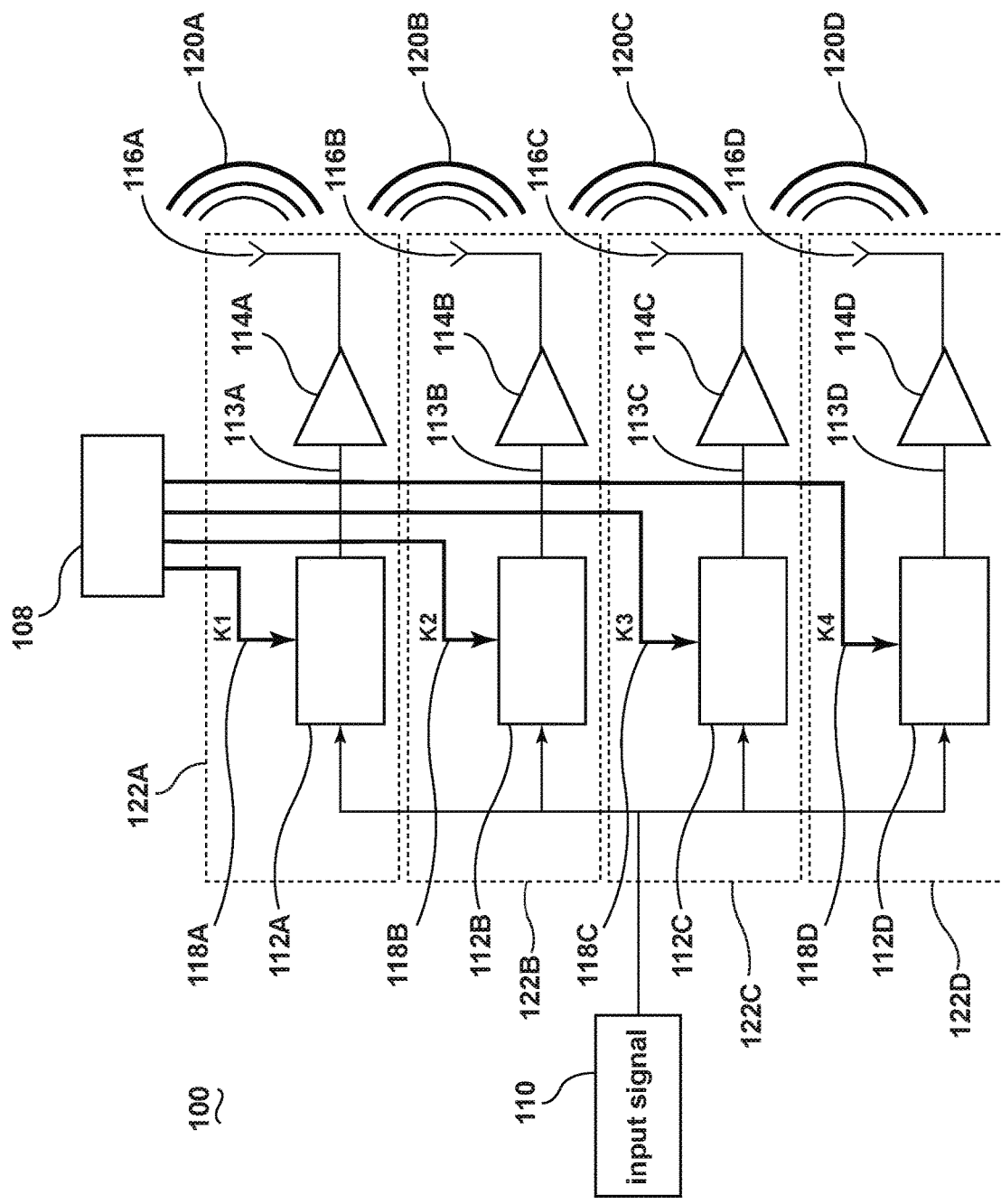
FIG. 2 is a block diagram illustrating an electromagnetic energy delivery system in accordance with various aspects described herein.

Referring now to FIG. 2, a block diagram of an RF electromagnetic energy delivery system 100 is shown. The electromagnetic energy delivery system 100 includes a set of phase shifting components 112A-D, amplifying components 114A-D and transmitting components 116A-D. The output of each phase shifting component 112A-D is coupled to the input of an amplifying component 114A-D. The output of each amplifying component 114A-D is coupled to the input of a transmitting component 116A-D. The signal path characterized by the serial coupling of a phase shifting component 112A-D to an amplifying component 114A-D to a transmitting component 116A-D forms an RF channel 122A-D.

A periodic input signal 110 is applied to each of the phase shifting components 112A-D. The periodic input signal 110 can be any signal suitable for amplification in an RF electromagnetic energy delivery system including, but not limited to, a low power common reference RF signal provided by an RF signal generator (cf. element 16 in FIG. 1).

The phase shifting components 112A-D each output a periodic signal 113A-D that is displaced with respect to the periodic input signal 110. Because the signals are periodic, the displacement is described as a phase shift where the phase shift is the angle between two points on a circle that represents the progress of the periodic signal through its cycle. Each of the phase shifting components 112A-D is configured to output a periodic signal 113A-D with a selected phase difference with respect to the periodic input signal 110. The phase shifting components 112A-D can be formed with any electronics suitable for adjusting the phase of a periodic RF signal including, but not limited to, a digital programmable RF phase shifter.

The phase shifting components 112A-D can apply a phase shift to the input signal 110 according to a control signal 118A-D. The control signals 118A-D can specify a phase shift such that the output periodic signals 113A-D from the phase shifting components 112A-D each has a controlled phase difference with respect to the input signal 110. The phase difference between each of the output periodic signals 113A-D and the input signal 110 can range from 0 to 360 degrees. Additionally, the output periodic signals 113A-D can have a phase difference between one another ranging from 0 to 360 degrees. The control signals 118A-D can be formed of any signal suitable for controlling the phase shift output from a phase shifting component, including, but not limited to, digital words, K1-K4, output from a controller 108.

The phase shifter output signals 113A-D are input to the amplifying components 114A-D that drive each transmitting component 116A-D. The amplifying components 114A-D each output a high power RF signal based on the low power input signal 110 with a phase shift as applied by the phase shifting components 112A-D. The amplifying components 114A-D can be any amplifier suitable for amplifying an RF signal including but not limited to a solid-state high power amplifier (e.g. elements 18A-D in FIG. 1).

The transmitting components 116A-D convert the amplified electrical output of the amplifying components 114A-D into RF waves 120A-D. The transmitting components 116A-D can be formed from any structural components suitable for transmitting RF power and converting RF power into electromagnetic waves including, but not limited to, waveguides, antennas and combinations thereof (e.g. RF feeds 26A-D in FIG. 1). The RF waves 120A-D can be transmitted into any space suitable for the propagation of electromagnetic energy and can include an enclosed cavity (e.g. element 20 in FIG. 1) or free space depending upon the application.

The ability of the electromagnetic energy delivery system 100 to control the interference pattern generated by the RF waves 120A-D depends on the accuracy of the realized phase shift of the combination of the phase shifting components 112A-D and the added delay of the amplifying components 114A-D to the transmitting components 116A-D.

Figure 3:
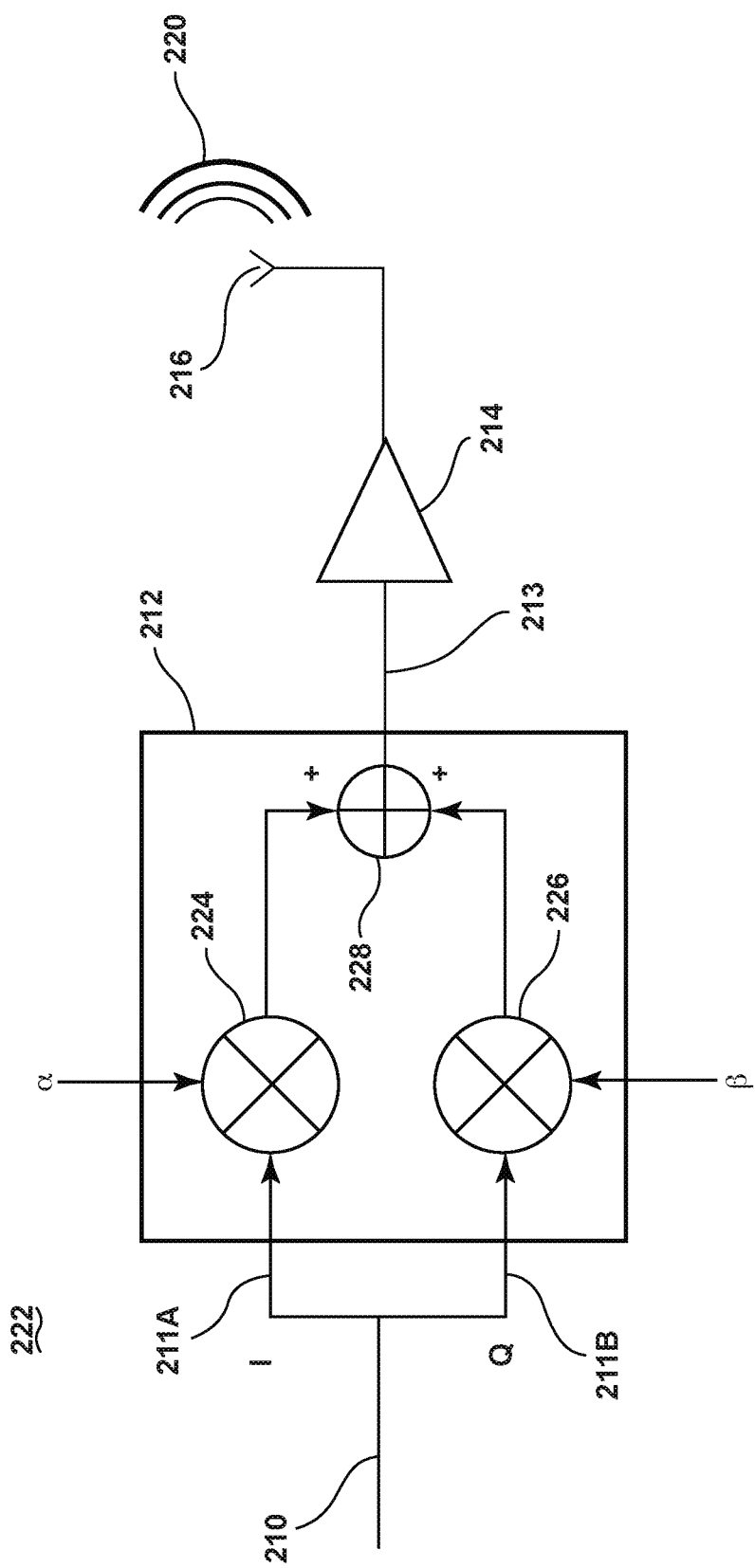
FIG. 3 is a block diagram illustrating a single channel of an electromagnetic energy delivery system where the phase of an output signal is set in accordance with various aspects described herein.

Referring now to FIG. 3, a block diagram illustrating a single channel 222 of an electromagnetic energy delivery system where the phase of the output signal is set in accordance with various aspects described herein is shown. The channel 222 includes a phase shifting component 212, an amplifying component 214 and a transmitting component 216 coupled in series. The input signal 210 includes two amplitude-modulated sinusoids that are offset in phase from one another by one-quarter cycle or 90 degrees. The two amplitude-modulated sinusoids are referred to in the art as quadrature signals and include an in-phase component 211A and a quadrature component 211B.

The phase shifting component 212 can include RF mixers 224, 226 that provide inputs to a summing amplifier 228. The phase shifted output signal 213 is formed as a linear combination of the two quadrature signals 211A, B such that a coefficient, $\alpha$, modulates the amplitude of the in-phase component 211A and a coefficient, $\beta$, modulates the amplitude of the quadrature component 211B. The amplitude modulated quadrature signals 211A, B are input to the summing amplifier 228. In this way, the phase shifted output signal 213 is a combination of the two quadrature signals 211A, B where the phase shift is determined by the values of the coefficients $\alpha$ and $\beta$.

The phase shifting component 212 outputs the phase shifted output signal 213 that is then input to the amplifying component 214. The amplifying component 214 outputs a high power RF signal that is an amplified version of the phase shifted output signal 213. The transmitting component 216 converts the amplified electrical output of the amplifying component 214 into RF wave 220. Multiple channels of an electromagnetic energy delivery system can be similarly configured and, in operation, can independently modulate the $\alpha$ and $\beta$ values for each channel.

Figure 4:
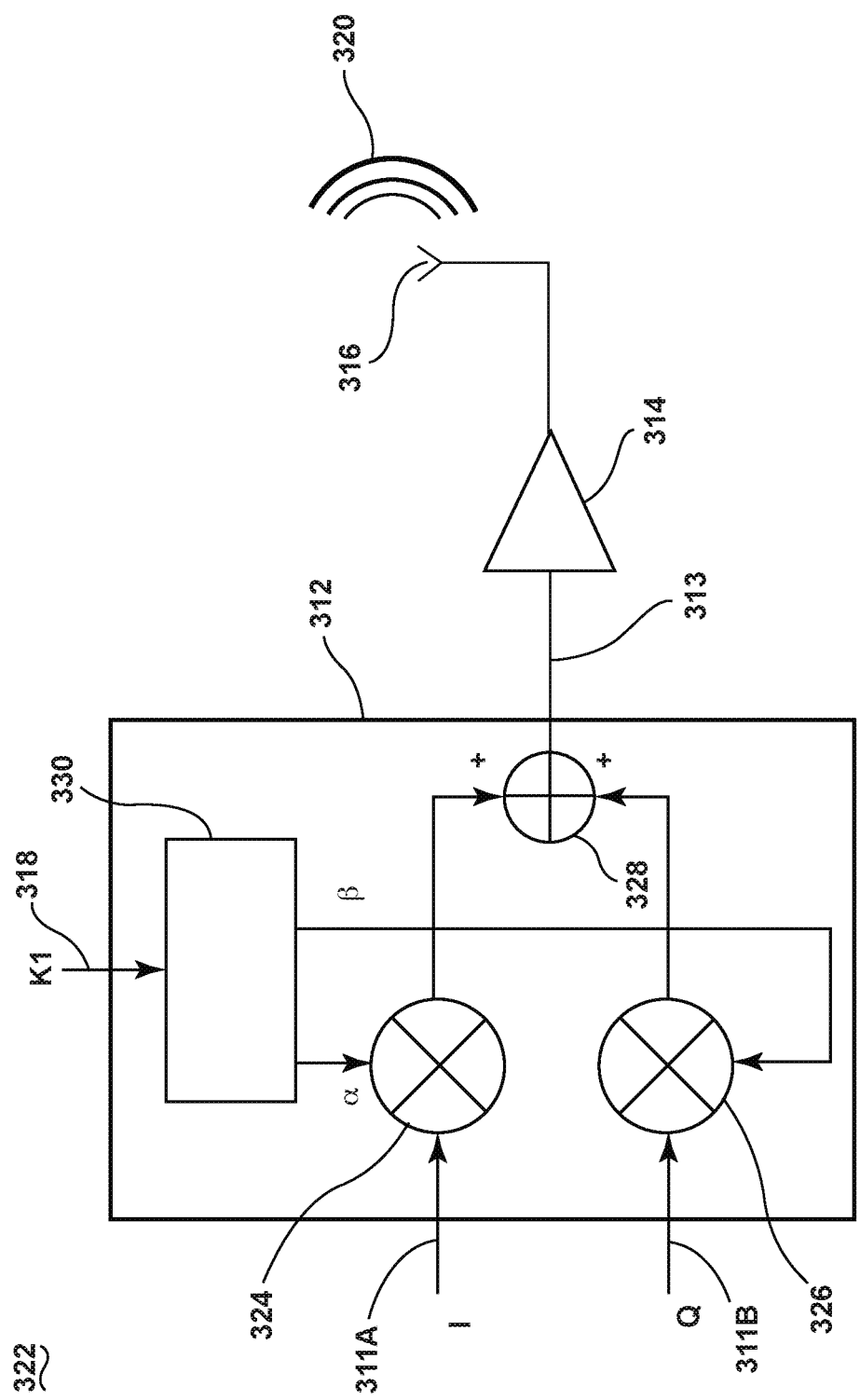
FIG. 4 is a block diagram illustrating another embodiment of a single channel of an electromagnetic energy delivery system where the phase of an output signal is set in accordance with various aspects described herein.

Referring now to FIG. 4, a block diagram illustrating a single channel 322 of an electromagnetic energy delivery system where the coefficients $\alpha$ and $\beta$ can be encoded in one or more control signals (e.g. elements 118A-D in FIG. 2) in accordance with various aspects described herein is shown. When an electromagnetic energy delivery system (e.g. element 100 in FIG. 2) includes multiple channels 322, all channels share the same quadrature inputs 311A,B. The single channel 322 is similar to the single channel 222 depicted in FIG. 3. Therefore, like parts will be identified with like numerals increased by 100, with it being understood that the description of the like parts of the first embodiment applies to the second embodiment, unless otherwise noted.

The phase shifting component 312 can include a converter block 330. The converter block 330 can translate a control signal 318 (e.g. a digital word) that specifies the per channel phase shift into a value for $\alpha$ and $\beta$ for each channel 322. The converter block 330 can be formed of any type of electronic device suitable for receiving one type of electronic signal and outputting another type of signal, including, but not limited to, digital-to-analog converters, analog-to-digital converters, frequency converters, voltage converters, frequency-to-voltage converters, voltage-to-frequency converters, current-to-voltage converters and combinations thereof that can be configured with hardware or software.

Figure 5:
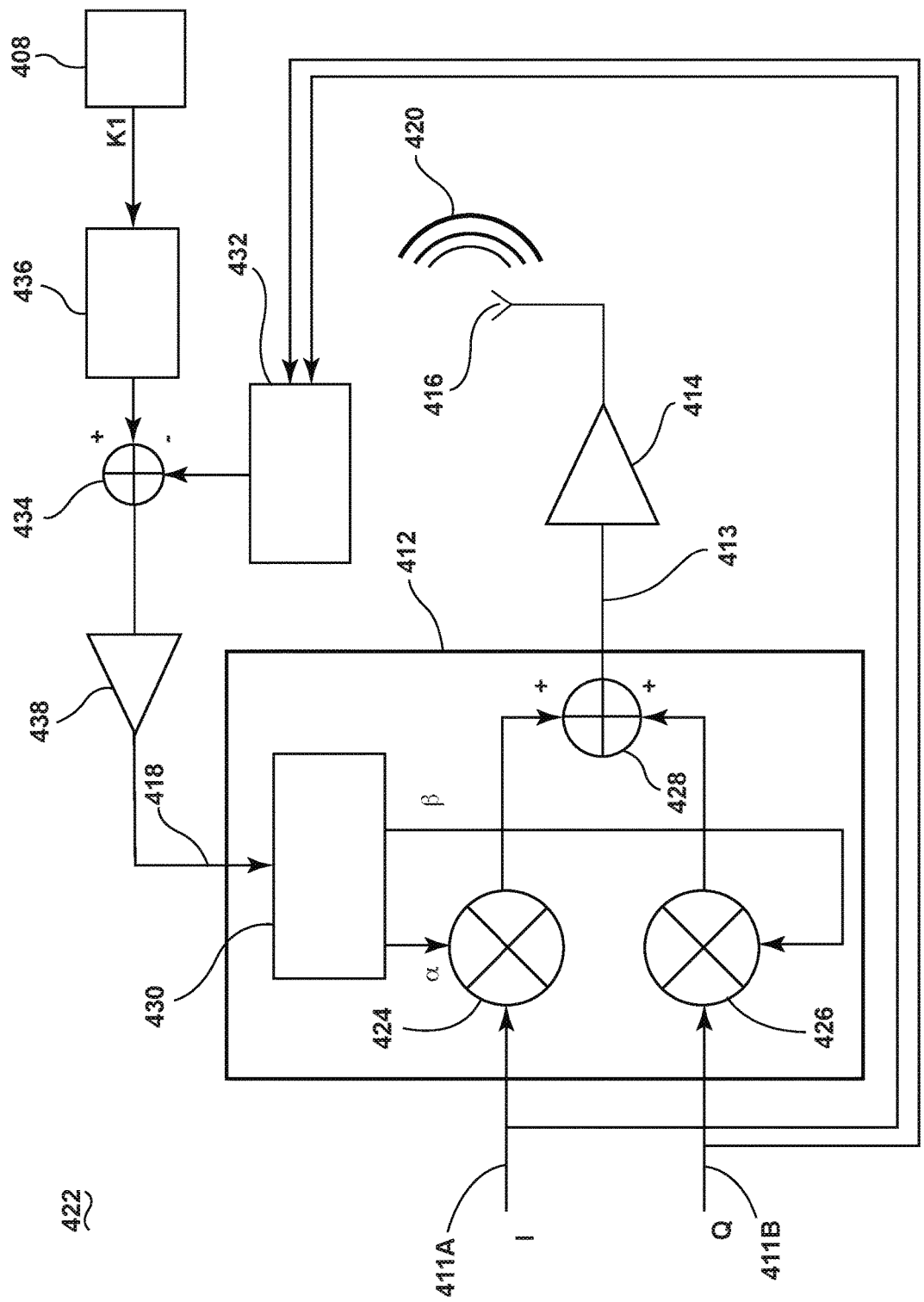
FIG. 5 is a block diagram illustrating yet another embodiment of a single channel of an electromagnetic energy delivery system where the phase of an output signal is set in accordance with various aspects described herein.

Referring now to FIG. 5, a block diagram illustrating a single channel 422 of an electromagnetic energy delivery system where the coefficients $\alpha$ and $\beta$ can be determined by feedback in accordance with various aspects described herein is shown. The single channel 422 is similar to the single channel 322 depicted in FIG. 4. Therefore, like parts will be identified with like numerals increased by 100, with it being understood that the description of the like parts of the embodiment shown in FIG. 4 applies to the embodiment shown in FIG. 5, unless otherwise noted.

The channel 422 includes a phase shifting component 412, an amplifying component 414 and a transmitting component 416 coupled in series for outputting an RF electromagnetic wave with an adjustable phase difference with respect to an input signal as characterized by the quadrature input signals 411A and B.

The channel 422 includes components configured to provide feedback for use in setting the per channel phase shift. A phase detecting component 432 can receive signals representative of the quadrature input signals 411A and B and the phase adjusted output of the amplifying component 414. The phase detecting component 432 can be configured to output the phase difference between the quadrature input signals 411A and B and the output of the amplifying component 414. The phase detecting component 432 can be formed of any combination of electronic devices suitable for generating a signal that represents the difference in phase between two signal inputs, including, but not limited to a frequency mixer, an analog multiplier, a logic circuit, etc.

The output of the phase detecting component 432 is input to a summing amplifier 434. Additionally, the summing amplifier 434 includes an input representative of a control signal output from a controller 408 by way of a converter block 436. The summing amplifier 434 can be configured to output the sum of the output of the converter block 436 and the negative of the output of the phase detecting component 432. In this way, the summing amplifier 434 can output the difference between the desired phase difference encoded in the control signal 418 and the actual phase difference output through the channel 422.

The converter block 436 can be configured to output a signal such that the desired phase difference encoded in the control signal from the controller 408 is converted into a signal commensurate to the output of the phase detecting component 432. That is, when the phase difference between the output of the amplifying component 414 and the quadrature input signals 411A and B is equal to the desired phase difference encoded in the control signal 418, the output of the converter block 436 and the phase detecting component 432 should be equal. A loop amplifier 438 can be configured to amplify the difference between the output of the converter block 436 and the output of the phase detecting component 432. The amplified output of the loop amplifier 438 is input to the converter block 430 of the phase shifting component 412. The converter block 430 converts the output of the loop amplifier 438 into an $\alpha$ and $\beta$.

When the phase difference between input quadrature signals 411A and B and the output of the amplifying component 414 is measured accurately and compared to a desired phase difference, the feedback loop formed by the phase detecting component 432, the converter block 436 and the loop amplifier 438 can control the α and β values for each channel 422 such that the phase difference between the input quadrature signals 411A and B and the output of the amplifying component 414 approaches the desired phase difference as encoded in the control signal 418.

Figure 6:
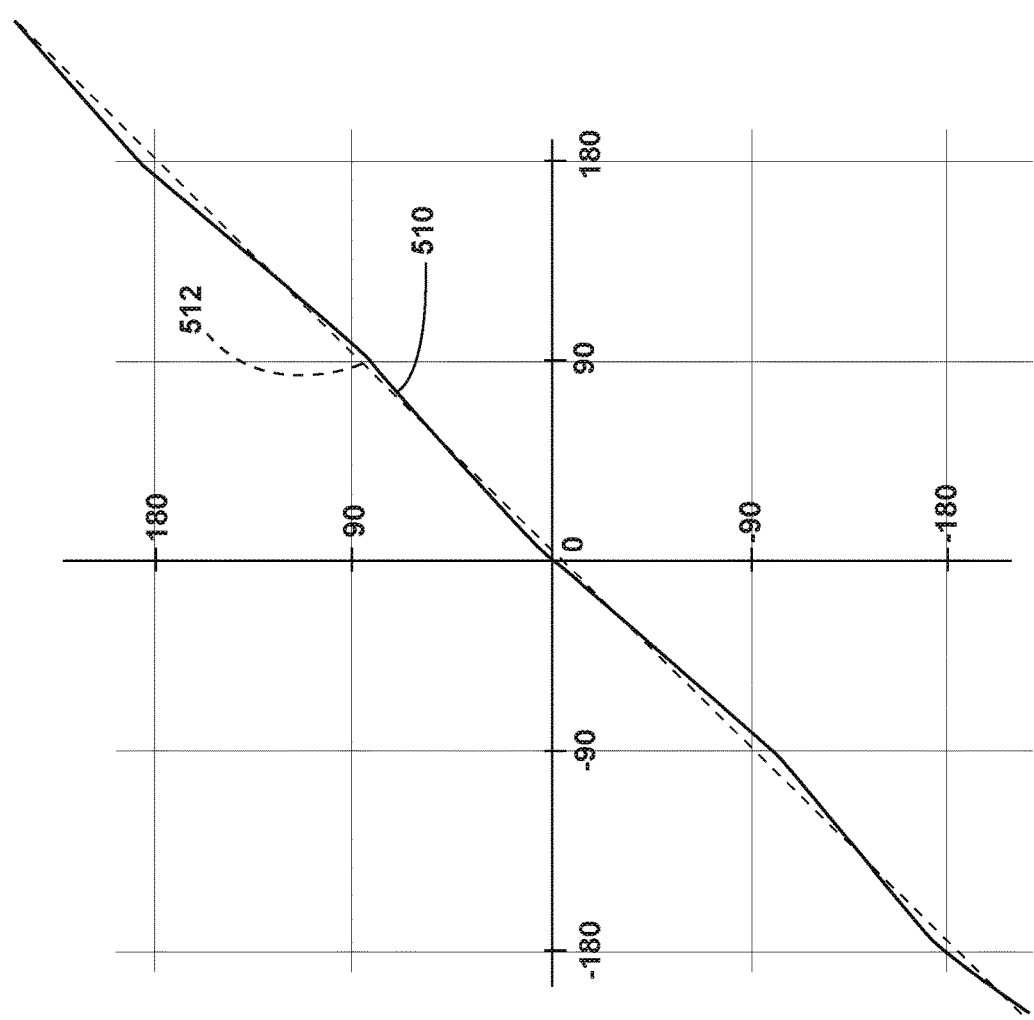
FIG. 6 is a diagram plotting a transfer function that characterizes the relationship between a desired phase difference and an actual phase difference between the input signal and the output signals for a channel of an electromagnetic energy delivery system in accordance with various aspects described herein.

Referring now to FIG. 6, a transfer function 510 characterizing the relationship between the desired phase difference encoded in the control signals and the actual phase difference between the input signal and the output signals for each of the channels is shown. As plotted in FIG. 6, the abscissa represents the desired phase difference and the ordinate represents the actual phase difference output from the channel. In a notional channel, the ideal transfer function 512 is linear. In an actual channel, the relationship between the desired phase difference encoded in the control signals and the actual phase difference between the input signal and the output signals for each of the channels is characterized by the limits of the underlying embodiment. That is, the realized phase difference will differ from the desired phase difference because of the performance limits of the actual components that make up the channel.

For example, in the embodiment of the channels 222 and 322 described in FIGS. 3 and 4, the RF mixing components 224, 226, 324, 326 that modulate the α and β values and the summing amplifier 228, 328 that sums the modulated quadrature input signals determine the accuracy, or degree to which the transfer function conforms to the ideal transfer function. Additionally, the differences between the delays of the amplifying components between the multiple channels can limit the accuracy of the realized phase differences by introducing a biasing error. In a second example, in the embodiment of the channel 422 described in FIG. 5, the feedback elements including the phase detecting component 432, the converter block 436, and the gain of the loop amplifier 438 determine the accuracy.

In the channels described in FIGS. 3-5, the phase difference between the quadrature input signals (i.e. the common in-phase and quadrature input signals) contributes to the accuracy of the overall transfer function that characterizes the phase difference between the common reference input signal and the output of each of the channels. When the in-phase and quadrature input signals have a 90-degree phase shift and all intervening functions in the system are perfectly ideal, the ideal transfer function 512 between desired phase difference and actual phase difference is a straight line as illustrated in FIG. 6. In an ideal channel, if the phase of the in-phase input signal is referenced as zero degrees, the channel can be configured to generate a 90-degree phase shift by passing the quadrature input completely by setting β equal to one and suppressing the in-phase input signal completely by setting α to zero. If, however, the phase difference between the in-phase and quadrature signals is actually, for example, 88 degrees instead of 90 degrees, the actual phase shift is 88 degrees when the channel was configured to output a 90-degree phase shift by setting α to zero and β to one. Similarly, the channel can be configured to output a 180-degree phase shift by setting α=−1 and β=0 by passing an inverted in-phase signal which has a 180-degree phase difference with respect to the in-phase signal if the in-phase signal is symmetric (i.e. no even harmonics). Therefore, the accuracy of the transfer function from desired phase difference to actual phase difference is determined, in part, by the phase error (i.e. the deviation from 90 degrees) between the in-phase and quadrature signals and the odd and even harmonic distortion of the in-phase and quadrature input signals. Therefore, the phase error between the in-phase and quadrature input signals and the error caused by harmonic distortion of the in-phase and quadrature input signals will dominate the inaccuracy of the transfer function 510 from desired to actual phase difference and characterize the non-linearity of the phase characteristic.

Figure 7:
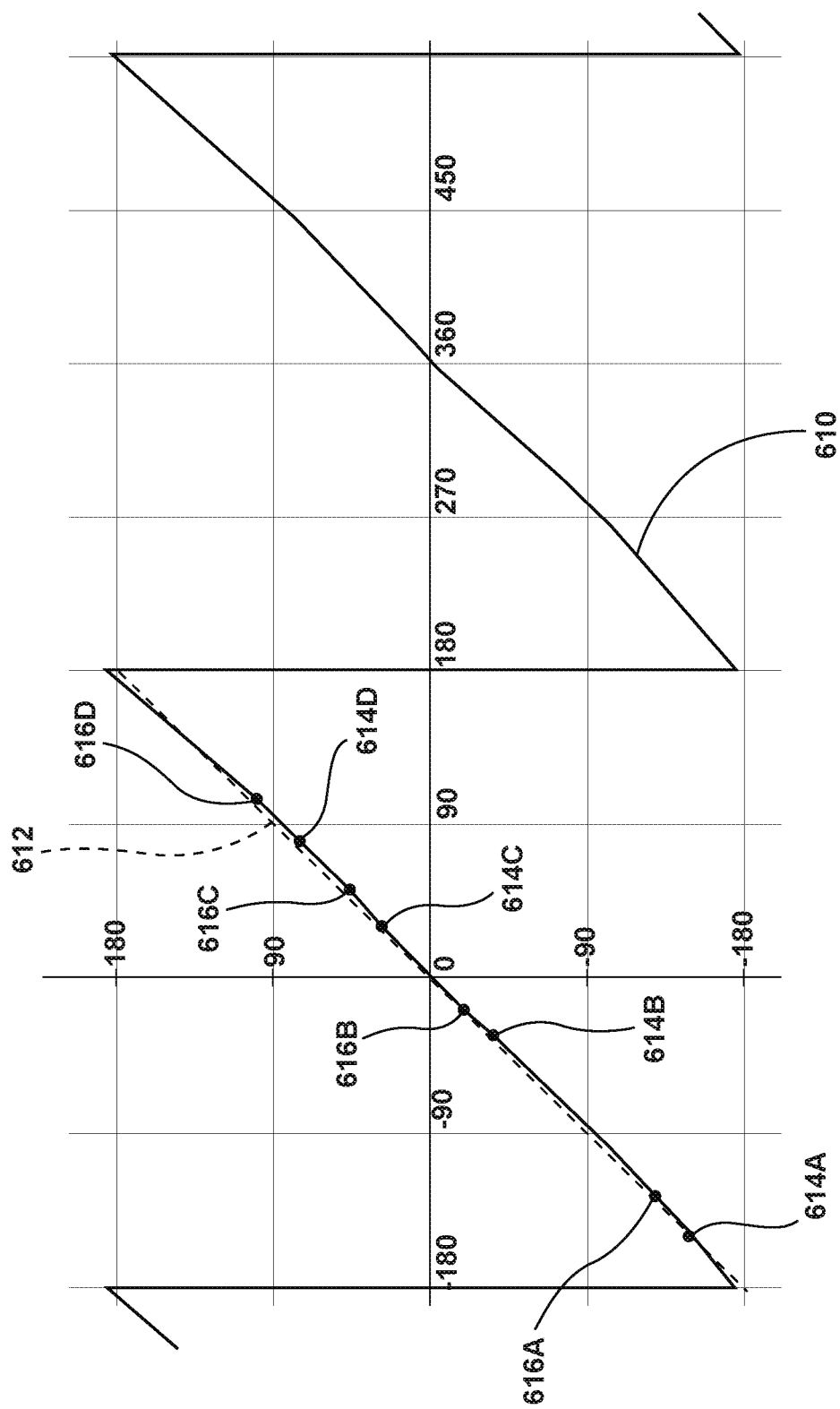
FIG. 7 is a diagram illustrating the circularity of the transfer function of FIG. 6.

Referring now to FIG. 7, a diagram illustrating the circularity of the transfer function of FIG. 6 is shown. That is, one property of the transfer function 610 for the actual phase difference versus the desired phase difference is that the deviations with respect to the ideal transfer function 612 repeat with a periodicity of 360 degrees. For example, a channel configured to set the desired phase difference to 361 degrees is equivalent to a channel configured to set the desired phase difference to 1 degree.

The circularity or wrapping of the phase transfer function 612 applies to any system that configures a channel with quadrature input signals as a reference for the generation of a desired phase difference. In a four channel system such as described above in FIGS. 1 and 2, four desired phase differences are set by a controller that encodes four digital words, K1 to K4, in four control signals. With respect to the transfer function 612, the digital words K1 to K4 encode four points 614A-D. Because the realized transfer function 610 deviates from the straight-line ideal transfer function 612, the actual phase differences will not be identical to the desired phase differences. By adding a fixed identical value to the set of digital words, K1 to K4, a second set of four points 616A-D are placed on the transfer function 610. Because the transfer function 610 deviates from the straight-line ideal transfer function 612, the second set of points 616A-D will cause the channel to output a phase difference different from that of the first set of points 614A-D.

Figure 8:
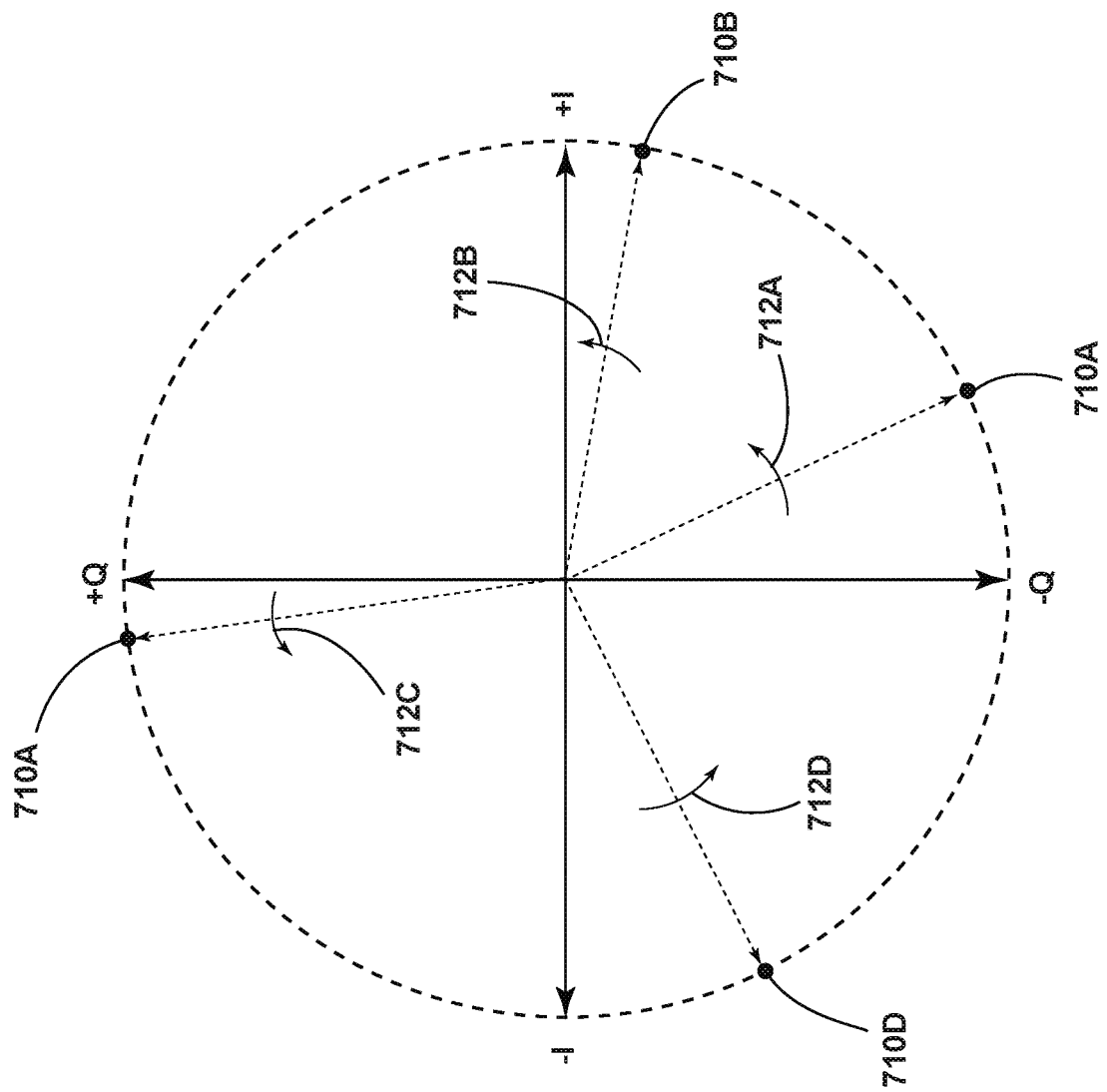
FIG. 8 is a diagram illustrating the phase difference for multiple channels of an electromagnetic energy delivery system in accordance with various aspects described herein.

Referring now to FIG. 8, a diagram illustrating the phase difference for multiple channels of an electromagnetic energy delivery system in accordance with various aspects described herein is shown. Each of the channels of the electromagnetic energy delivery system includes an output signal encoded as a vector 710A-D. Each vector 710A-D is composed of a combination of the quadrature input signals and is illustrated in FIG. 8 where the x-axis represents the in-phase input signal and the y-axis represents the quadrature input signal. Accordingly, the phase differences between the output signals for each channel are determined as a function of the angles between the vectors.

The vectors 710A-D representing the output signals for the channels are encoded in the digital words (e.g. K1 to K4) transmitted in control signals output from the controller (e.g. 408 in FIG. 5). That is, setting the values K1 to K4 determines the angle of each of the four vectors. Increasing each digital word, K1 to K4, by an identical value introduces a rotation 712A-D of the four vectors. If the phase transfer function was an ideal transfer function (e.g. dotted line 612 in FIG. 7), then the phase differences between the four vectors 710A-D would be unaffected by the rotation 712A-D. However, when the realized phase transfer function (e.g. line 610 in FIG. 7) is not linear, the phase increase of the four vectors as they are rotated can differ from one another and, consequently, the relative phase differences will vary.

The controller can be configured to increase each digital word at a fixed time instance to effectively rotate the four vectors slowly around the circle by changing the relative contributions of the quadrature inputs for each output signal of each channel. At each time step, the phase differences between the four vectors will change slightly because of the aforementioned deviations of the phase transfer function with respect to the ideal phase transfer function. However, after completely rotating around the circle defined by the quadrature input signals, each vector returns to precisely the same initial phase difference with respect to the quadrature input signal. Consequently, the phase differences between the four vectors upon a complete 360-degree rotation return to the same initial phase differences prior to any vector rotation. Therefore, the average phase differences between the output signals of the channels will be constant. The controller (e.g. 408 in FIG. 5) can be configured to increase or decrease each digital word by any value and time step suitable for mitigating the phase deviations in the phase transfer function, including, but not limited to, increasing the digital words by a value to rotate each vector by one degree every millisecond.

Figure 9:
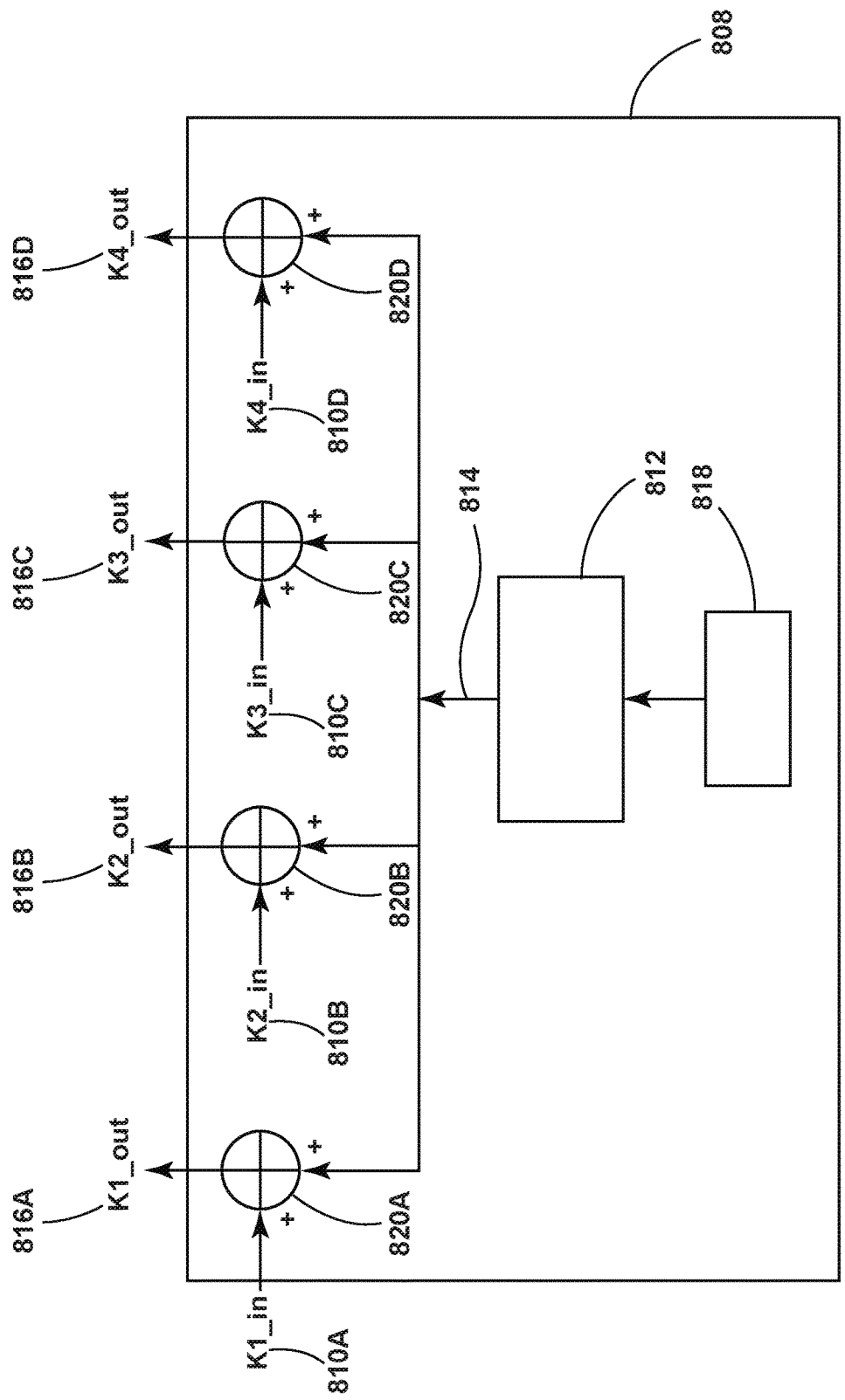
FIG. 9 is a block diagram illustrating a controller for setting the phase for multiple channels of an electromagnetic energy delivery system in accordance with various aspects described herein.

Referring now to FIG. 9, a block diagram illustrating an embodiment of a controller 808 for setting phase differences for an RF electromagnetic energy delivery system is shown. The controller 808 includes a set of inputs 810A-D that are combined with a value encoded in a signal 814 output from a wrap-around counting component 812. The value encoded in the output signal 814 is combined with each of the set of inputs 810A-D via summing amplifiers 820A-D to output a control signal 816A-D for setting the phase for each channel of the RF electromagnetic energy delivery system.

The set of inputs 810A-D express the desired phase differences for a set of signals to be output from a set of RF channels. The set of inputs 810A-D can be any control signal suitable for encoding a desired phase difference, including, but not limited to, a control signal that encodes a digital word. The set of inputs 810A-D can originate from any suitable RF controlling component internal or external to the controller 808 including, but not limited to, a digital control interface. Each of the set of inputs 810A-D is input to a summing amplifier 820A-D and increased or decreased by the value encoded in the output signal 814 from the wrap-around counting component 812.

The wrap-around counting component 812 outputs a signal that encodes a progressively increasing or decreasing value. The output signal 814, which can encode a value in the form of a digital word, iterates to a progressively larger or smaller value. The wrap-around counting component 812 can include an input from a timing component 818, such as a clock, for moderating the time step of the iterative progression. Upon reaching a minimum or maximum value, the wrap-around counting component 812 can perform a modular arithmetic operation to wrap the encoded value back to some initial value (e.g. zero). The digital word encoded in the output signal 814 represents a phase step, $\Delta\phi$. The largest value that the wrap-around counting component 812 can generate represents an integer multiple of 360 degrees to avoid large phase steps when the value is wrapped at the proceeding iteration. The wrap-around counting component 812 outputs a signal that ensures the average phase differences are identical to the desired phase differences over a cycle of operation. The wrap-around counting component 812 can be configured to increase or decrease each digital word encoding $\Delta\phi$ by any value for any time step suitable for mitigating the phase deviations in the phase transfer function, including, but not limited to, setting $\Delta\phi$ to one degree and the time step to one millisecond.

In another implementation, the wrap-around counter 812 can be configured to randomly change the digital word encoded in the output signal 814 at each time step triggered by the timing component 818. In this way, the phase step $\Delta\phi$ can be uniformly distributed on the range of phases from 0 to 360 degrees. Other phase distributions are contemplated and can include distributions that compensate for any systematic non-linearity that does not arise from random variation. In yet another implementation, the wrap-around counter 812 can be configured to change the digital word according to non-regular time steps where the time duration can alter from time step to time step.

Figure 10:
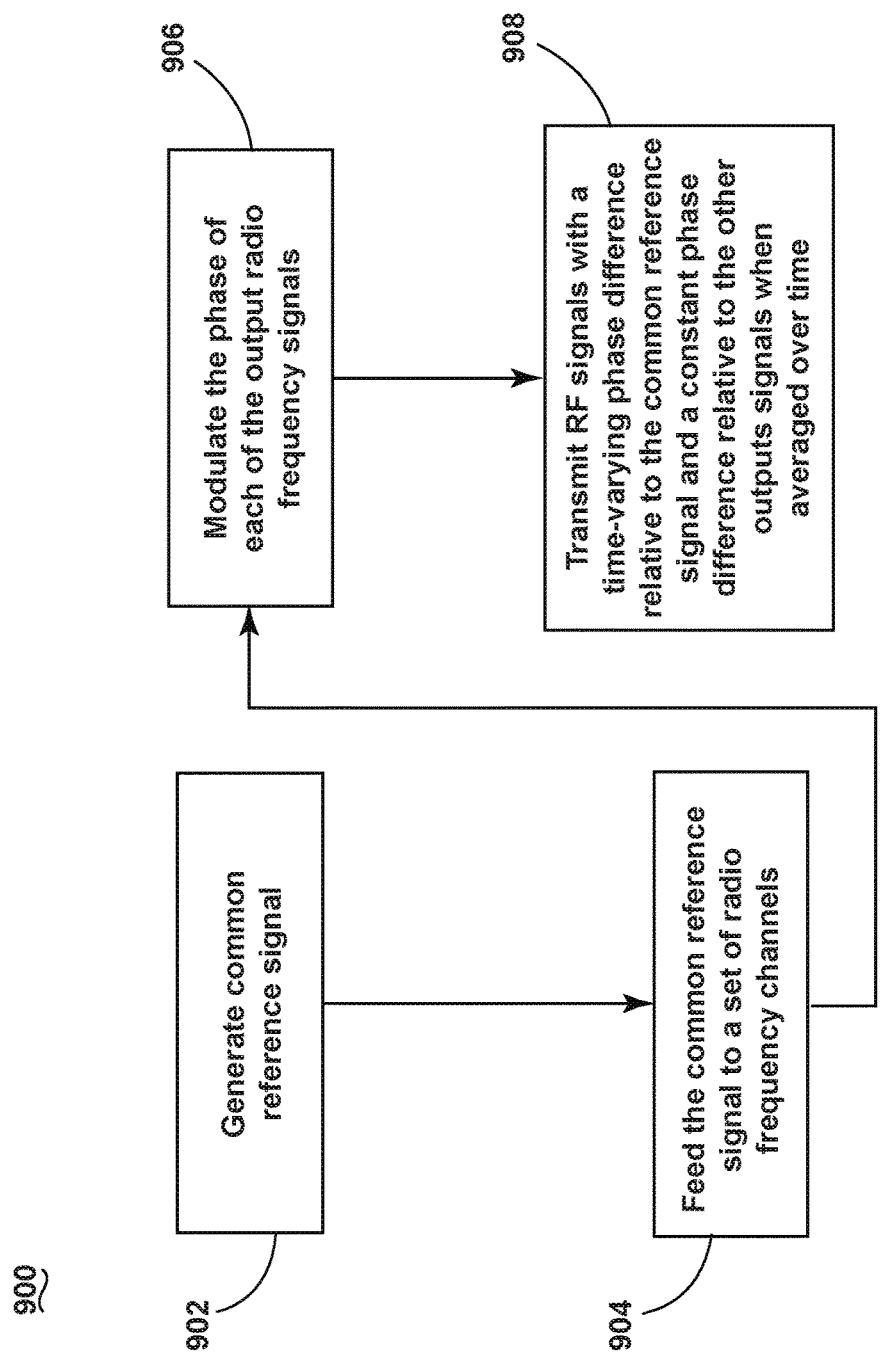
FIG. 10 is a flowchart illustrating a method of delivering radio frequency electromagnetic energy in accordance with various aspects described herein.

Referring now to FIG. 10, a flowchart illustrating a method 900 of delivering RF electromagnetic energy in accordance with various aspects described herein is shown. The method 900 includes steps to: generate a common reference RF signal at a first phase; feed the common reference RF signal to a set of output channels; and modulate the phase of each of the output RF signals. Each output signal is configured to transmit an RF signal with a time-varying phase difference relative to the common reference signal and a phase difference relative to the other output signals that is constant when averaged over time.

At step 902, the electromagnetic energy delivery system can generate a common reference signal with an RF generating component (e.g. RF signal generator 16 in FIG. 1). The common reference signal can be any periodic signal including, but not limited to, two amplitude-modulated radio frequency sinusoids that are offset in phase from one another by a fixed amount such as one-quarter cycle or 90 degrees.

At step 904, the electromagnetic energy delivery system can be configured to feed or couple the common reference signal input from the RF generating component (e.g. RF signal generator 16 in FIG. 1) to a set of RF channels (e.g. RF channels 122A-D in FIG. 2). Each of the RF channels can be configured to deliver an output radio frequency signal such as by transmitting the signal from an antenna. In a cooking application as described above for FIG. 1, each channel can be configured to output the radio frequency signal to an enclosed cavity, which holds foodstuff to be cooked according to a cycle of operation.

At step 906, a phase shifting component (e.g. elements 112A-D in FIG. 2) can modulate the phase of each of the RF signals that are to be output from each channel. The electromagnetic energy delivery system can include any suitable techniques and components for determining and controlling the modulation of the phase of the output RF signal for each channel. Techniques and components can include, but are not limited to, feedback and feedforward topologies, RF phase shifters, processors, loop amplifiers, etc.

At step 908, the electromagnetic energy delivery system can transmit the RF signals with a time-varying phase difference relative to the common reference signal and a constant phase difference relative to the other output signals when averaged over time. The system can be configured to vary the phase of each output signal deterministically or randomly.

As described above, the method includes steps to determine and set the phase of a set of contiguous RF electromagnetic energy transmission. The method enables an RF electromagnetic energy system such as can be implemented in a solid-state electromagnetic cooking device to accurately transmit a set of RF signals with a desired set of phase differences. The method results in better coherence of the output RF signals because the resultant phase differences in the transmitted signals approach the desired phase differences over time.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the device as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present device. The exemplary structures and processes disclosed herein are for illustrative purposes and are not to be construed as limiting.

It is also to be understood that variations and modifications can be made on the aforementioned structures and methods without departing from the concepts of the present device, and further it is to be understood that such concepts are intended to be covered by the following claims unless these claims by their language expressly state otherwise.

The above description is considered that of the illustrated embodiments only. Modifications of the device will occur to those skilled in the art and to those who make or use the device. Therefore, it is understood that the embodiments shown in the drawings and described above is merely for illustrative purposes and not intended to limit the scope of the device, which is defined by the following claims as interpreted according to the principles of patent law, including the Doctrine of Equivalents.

What is claimed is:

1. An electromagnetic energy delivery system comprising:
   a set of radio frequency channels, each channel comprising:
      a radio frequency feed configured to radiate electromagnetic energy;
      at least one high-power radio frequency amplifier coupled to the radio frequency feed, each high-power radio frequency amplifier comprising at least one amplifying component configured to output a periodic signal that is amplified in power with respect to an input radio frequency common reference signal; and
      a phase-shifting component configured to modulate the phase of the output periodic signal with respect to the input radio frequency signal; and
   a controller coupled to the set of radio frequency channels, the controller configured to cause the output periodic signals from each of the radio frequency channels is to have a time-varying phase difference relative to the common reference signal and a phase difference relative to the other output periodic signals that is constant when averaged over time.

2. The system of claim 1 further including a radio frequency signal generator coupled to the set of radio frequency channels for generating the input radio frequency common reference signal.

3. The system of claim 1 wherein the input radio frequency common reference signal comprises two periodic signals with a fixed phase difference.

4. The system of claim 3 wherein the fixed phase difference is 90 degrees.

5. The system of claim 1 wherein the controller is configured to cause the time-varying phase difference relative to the common reference signal by transmitting digital words to each of the radio frequency channels.

6. The system of claim 5 wherein the controller further includes a wrap-around counting component configured to periodically increase or decrease the digital words by the same value to cause a periodic increase or decrease of the phase difference between the output signals of the radio frequency channels and the common reference signal.

7. The system of claim 6 wherein the wrap-around counting component is configured to generate a maximum value that corresponds to an integer multiple of 360 degrees.

8. The system of claim 5 wherein the controller further includes a wrap-around counting component configured to increase or decrease the digital words by a random value to cause an increase or decrease of the phase difference between the output signals of the radio frequency channels and the common reference signal.

9. The system of claim 8 wherein the random value is selected according to a uniform distribution.

10. The system of claim 5 wherein the controller is further configured to increase or decrease the digital words according to a distribution to cause an increase or decrease of the phase difference between the output signals of the radio frequency channels and the common reference signal that compensates for systematic errors in the system.

11. The system of claim 1 further including an enclosed cavity in which the radio frequency feeds radiate electromagnetic energy.

12. A method of delivering radio frequency electromagnetic energy to cook foodstuff in an enclosed cavity of a cooking device, the method comprising:
   generating, with a microwave signal generating component, a common reference radio frequency signal at a first phase;
   feeding the common reference radio frequency signal to a set of output channels, each channel configured to deliver an output radio frequency signal to the enclosed cavity; and
   modulating the phase, by a phase shifting component, of each of the output radio frequency signals;
   wherein each output signal is configured to provide a time-varying phase difference relative to the common reference signal and a phase difference relative to the other output signals that is constant when averaged over time.

13. The method of claim 12 wherein the common reference signal comprises two periodic signals with a fixed phase difference.

14. The method of claim 13 wherein the fixed phase difference is 90 degrees.

15. The method of claim 12 wherein the time-varying phase difference relative to the common reference signal is encoded in digital words transmitted to each of the output channels.

16. The method of claim 15 wherein the digital words periodically increase or decrease by the same value to cause a periodic increase or decrease of the phase difference between the output signals of the output channels and the common reference signal.

17. The method of claim 16 wherein the maximum value that can be encoded in the digital words corresponds to an integer multiple of 360 degrees.

18. The method of claim 15 wherein the digital words increase or decrease by a random value to cause an increase or decrease of the phase difference between the output signals of the output channels and the common reference signal.

19. The method of claim 18 wherein the random value is selected according to a uniform distribution.

20. The method of claim 18 wherein the random value is selected according to a distribution to cause an increase or decrease of the phase difference between the output signals of the output channels and the common reference signal that compensates for systematic errors in electronic components that form a radio frequency electromagnetic energy delivery system.

* * * * *